(12) United States Patent
Kano et al.

(10) Patent No.: US 8,018,759 B2
(45) Date of Patent: Sep. 13, 2011

(54) TUNNEL MAGNETIC RESISTANCE EFFECT MEMORY

(75) Inventors: Hiroshi Kano, Kanagawa (JP); Yutaka Higo, Kanagawa (JP); Tetsuya Yamamoto, Kanagawa (JP); Hiroyuki Ohmori, Kanagawa (JP); Masanori Hosomi, Kanagawa (JP); Shinichiro Kusunoki, Kanagawa (JP); Yuki Oishi, Kanagawa (JP); Kazutaka Yamane, Kanagawa (JP); Kazuhiro Bessho, Kanagawa (JP); Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/817,327

(22) Filed: Jun. 17, 2010

(65) Prior Publication Data
US 2010/0328992 A1    Dec. 30, 2010

(30) Foreign Application Priority Data
Jun. 25, 2009  (JP) .............................. P2009-151515

(51) Int. Cl.
*G11C 11/00* (2006.01)
(52) U.S. Cl. ......... 365/158; 365/148; 365/171; 977/935
(58) Field of Classification Search .................. 365/158, 365/131, 66, 48, 55, 62, 74, 78, 80–93, 100, 365/130, 148, 171–173, 225.5, 243.5; 257/421, 257/E21.665; 438/3; 977/933, 934, 935; 216/22; 428/810–816, 817–825.1, 826
See application file for complete search history.

(56) References Cited

U.S. PATENT DOCUMENTS

| | | | | |
|---|---|---|---|---|
| 6,845,038 | B1* | 1/2005 | Shukh ........................... | 365/171 |
| 2001/0005301 | A1* | 6/2001 | Komuro et al. ............. | 360/324.2 |
| 2002/0163766 | A1* | 11/2002 | Eguchi et al. ............ | 360/324.12 |
| 2009/0027813 | A1* | 1/2009 | Carey et al. .............. | 360/324.12 |

FOREIGN PATENT DOCUMENTS
JP    2003-017782    1/2003

OTHER PUBLICATIONS
Nikkei Electronics, pp. 164-171, Feb. 12, 2001.

* cited by examiner

*Primary Examiner* — Richard Elms
*Assistant Examiner* — Harry W Byrne
(74) *Attorney, Agent, or Firm* — K&L Gates LLP

(57) ABSTRACT

A memory includes: a plurality of memory devices, each including a tunnel magnetic resistance effect device containing a magnetization free layer in which a direction of magnetization can be reversed, a tunnel barrier layer including an insulating material, and a magnetization fixed layer provided with respect to the magnetization free layer via the tunnel barrier layer with a fixed direction of magnetization; a random access memory area in which information is recorded using the direction of magnetization of the magnetization free layer of the memory device; and a read only memory area in which information is recorded depending on whether there is breakdown of the tunnel barrier layer of the memory device or not.

5 Claims, 3 Drawing Sheets

TUNNEL MAGNETIC RESISTANCE EFFECT MEMORY

CROSS REFERENCES TO RELATED APPLICATIONS

The present application claims priority to Japanese Priority Patent Application JP 2009-151515 filed in the Japan Patent Office on Jun. 25, 2009, the entire content of which is hereby incorporated by reference.

BACKGROUND

The present application relates to a memory having memory devices.

A system using memories in related art typically uses read only memories (ROMs) that keep information even after power is turned off and random access memories (RAMs) that volatilize information when power is turned off, but can repeatedly perform fast and infinite recording and readout.

These memories in related art are divided into two types of ROMs such as flash memories and RAMs such as dynamic random access memories (DRAMs) and statistic random access memories (SRAMs), and respectively have unique structures.

Recently, memories so-called nonvolatile RAMs such as magnetic random access memories (MRAMs) and ferromagnetic random access memories (FeRAMs) have emerged.

The nonvolatile RAMs have the capability of fast repeated writing and random-access readout equal to that of the RAMs, and do not lose information even after power is turned off.

It is considered that, using the nonvolatile RAMs, the system using both ROMs and RAMs in related art can be simplified and, as a result, its price can be reduced.

In this case, unique information of the system such as a serial number and a network ID and an encryption key for communication etc., which have been placed in the ROMs, are stored in a rewritable RAM area.

Further, as a new nonvolatile RAM, a configuration of spin injection type memory devices in which the direction of magnetization of a ferromagnetic layer of a tunnel magnetic resistance effect device is reversed by spin injection has been proposed (e.g., see JP-A-2003-17782 and NIKKEI ELECTRONICS, Feb. 12, 2001 issue, pp. 164-171).

In the case of the configuration, the nonvolatile RAM has a property of fast repeated writing and random-access readout equal to that of the RAM, and does not lose information even after power is turned off like the above described MRAM.

Therefore, even using the spin injection type memory devices, the system using both ROMs and RAMs in the related art can be simplified as is the case of the above described MRAMs.

SUMMARY

Currently, the nonvolatile memories expected to be usable as RAMs include the above described FeRAMs and MRAMs, for example.

Under typical usage conditions, information written in the FeRAMs and MRAMs is held even after power is turned off.

However, in the case where the FeRAMs and MRAMs are used in place of ROMs, information is placed in a RAM area where information is rewritable. Accordingly, there is a slight possibility that data changes due to bugs of programs, exogenous noise, or the like, and there is a danger that indispensable information for activation of the system may be lost.

It is known that there is a possibility that information may be lost from FeRAMs due to heat at soldering of chips or the like and from MRAMs due to strong external magnetic fields.

Accordingly, it may be impossible to easily perform both the function of the complete ROM that is hardly lose information and the function of the RAM that is freely read and written.

Further, also, in the case where the spin injection type memory devices are used in place of ROMs without change, there is a possibility that information may be lost as is the case of using the FeRAMs and MRAMs.

Thus, it is desirable to provide a memory that can realize both a ROM and a RAM using memory devices having the same configuration.

A memory of an embodiment includes an memory device including a tunnel magnetic resistance effect device containing a magnetization free layer in which a direction of magnetization can be reversed, a tunnel barrier layer including an insulating material, and a magnetization fixed layer provided with respect to the magnetization free layer via the tunnel barrier layer with a fixed direction of magnetization.

Further, the memory includes a plurality of the memory devices having the configuration, and a random access memory area in which information is recorded using the direction of magnetization of the magnetization free layer of the memory device and a read only memory area in which information is recorded depending on whether there is breakdown of the tunnel barrier layer of the memory device or not.

According to the configuration of the memory of an embodiment, the random access memory area in which information is recorded using the direction of magnetization of the magnetization free layer of the memory device and the read only memory area in which information is recorded depending on whether there is breakdown of the tunnel insulating layer of the memory device or not are included.

In the memory device of the random access memory area, one of a first resistance state of high resistance and a second resistance state of low resistance is shown depending on the direction of magnetization of the magnetic free layer. In the memory device of the read only memory area, if the tunnel barrier layer has not been broken down, the first resistance state or the second resistance state is shown. On the other hand, if the tunnel barrier layer has been broken down, a third resistance state of the sufficiently lower resistance than in the second resistance state is shown.

Further, by sensing the above described three resistance states, contents of the recorded information can be read out. Thereby, using the memory devices having the same configuration, both the random access memory (RAM) and the read only memory (ROM) can be realized.

According to an embodiment, both the random access memory (RAM) and the read only memory (ROM) can be realized using the memory devices having the same configuration. Thereby, a ROM chip and a RAM chip that have been separately manufactured in related art can be replaced by one chip.

Since both the RAM and the ROM can be realized using the memory devices having the same configuration, the types of circuit parts and the manufacturing cost can be reduced.

Further, since a circuit in related art that has been formed by two independent chips of a ROM chip and a RAM chip can be formed by one chip, and simplification of the circuit configuration of the memory and downsizing of the memory can be realized.

Additional features and advantages are described herein, and will be apparent from the following Detailed Description and the figures.

DETAILED DESCRIPTION

Figure 1:
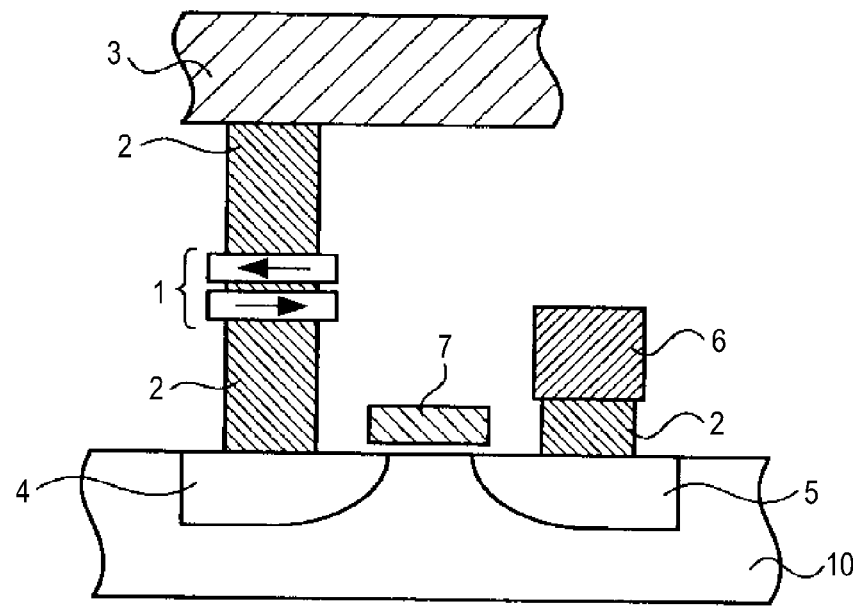
FIG. 1 is a schematic configuration diagram (a sectional view of a memory cell) of a memory of an embodiment.

The present application will be described in detail below with reference to the drawings according to an embodiment.

The explanation will be made in the following order.
1. Outline
2. Configuration of Memory device of Memory of One Embodiment
3. Experimental Example of Memory device
4. Circuit Configuration of Memory of One Embodiment
5. Modified Examples

1. Outline

Prior to the explanation of a specific embodiment, an outline of the present application will be explained.

In an embodiment, a memory (a memory device) is formed using plural memory devices including tunnel magnetic resistance effect devices.

Further, the plural memory devices forming the memory are sorted into a random access memory (RAM) area and a read only memory (ROM) area.

In the random access memory (RAM) area, information is recorded using a direction of magnetization of a magnetic free layer of the memory device including the tunnel magnetic resistance effect device. In the read only memory (ROM) area, information is recorded depending on whether there is breakdown or not in a tunnel insulating layer of the memory device including the tunnel magnetic resistance effect device.

In the random access memory (RAM) area, since information is recorded using the direction of magnetization of the magnetic free layer of the memory device, the magnetic free layer acts as a memory layer.

In the read only memory (ROM) area, since information is recorded depending on whether there is breakdown or not in the tunnel insulating layer of the memory device. Accordingly, the direction of magnetization of the magnetic free layer of the memory device is arbitrary, and the magnetic free layer is not used as a memory layer for storing information.

When information is recorded in the memory device in the random access memory (RAM) area, a current having a magnitude that reverses the magnetization direction of the magnetic free layer is supplied by spin injection, or an external magnetic field having a magnitude that reverses the magnetization direction is applied to the magnetic free layer. Of them, the external magnetic field can easily be applied by providing wiring for magnetic field application near the magnetic free layer of the memory device and flowing a current in the wiring to generate a current magnetic field.

Then, at recording of information, the resistance of the memory device is changed between a first resistance state of high resistance and a second resistance state of low resistance. As described in the above mentioned patent document 1 and non-patent document 1, or the like, in the tunnel magnetic resistance effect device, these two resistance states can reversibly be changed without material fatigue, i.e., destruction of devices.

Therefore, the memory device including the tunnel magnetic resistance effect device used for the memory of the embodiments of the invention is advantageous in resistance to repeated recording, which is necessary when the device is used as a RAM.

When information is recorded in the memory device in the read only memory (ROM) area, a tunnel barrier layer is broken down by applying a higher voltage than the breakdown withstand voltage of the tunnel barrier layer to the memory device. For application of the voltage, a voltage supply unit including wirings connected on and under the memory device etc. is provided.

In this manner, information is recorded by breaking down the tunnel barrier layer. Since the breakdown of the tunnel barrier layer is an irreversible change, the information is hard to be lost. That is, the memory device in which information has been recorded by breakdown can be used as a read only memory (ROM).

Further, to read out the information recorded in the memory device, the resistance of the device is detected by applying a voltage for readout to the memory device. In the memory device of the random access memory (RAM) area, whether the first resistance state of high resistance or the second resistance state of low resistance is determined using a sense amplifier or the like. In the memory device of the read only memory (ROM) area, whether the first resistance state or the second resistance state, or a third resistance state in which the tunnel barrier layer has been broken down is determined using a sense amplifier or the like.

Note that, in the case where the memory device has a configuration in which the magnetization direction of the magnetic free layer is reversed by spin injection, the voltage for readout is set to a lower voltage than a voltage for supplying the current having the magnitude that reverses the magnetization direction (writing voltage).

In the memory device used for the memory of the embodiments of the invention, known materials used for the tunnel magnetic resistance effect device may be used as the materials of the respective layers of the magnetic free layer, the tunnel insulating layer, a magnetization fixed layer, an anti-ferromagnetic layer, and the like.

Further, in the case where the memory device has a configuration in which the magnetization direction of the magnetic free layer is reversed by spin injection, for the memory device in the random access memory (RAM) area, a current supply unit that supplies a current to the memory device for recording information is provided. The current supply unit may include wirings connected on and under the memory device or the like, for example.

In the memory of the embodiments of the invention, both a random access memory (RAM) and a read only memory (ROM) can be realized using memory devices having the same configuration.

Therefore, a configuration in which memory devices in the random access memory (RAM) area and memory devices in the read only memory (ROM) area are accommodated in the same chip can be realized. Thereby, a ROM chip and a RAM chip that have been separately manufactured in related art can be replaced by one chip.

Further, since both the RAM and the ROM can be realized using the memory devices having the same configuration, the types of circuit parts and the manufacturing cost can be reduced.

Furthermore, since a circuit that has been formed by two independent chips of a ROM chip and a RAM chip in related art can be formed by one chip, and simplification of the circuit configuration and downsizing of the memory can be realized.

Note that the distinction between the ROM and the RAM area may be determined in advance at manufacturing or set by a user in use.

In the case where a user sets it in use, for example, an input unit that externally inputs information to a memory chip having plural memory devices is provided. Further, when it is practically used, it is operated so that some of memory devices from the plural memory devices may be assigned to the RAM area and other memory devices may be assigned to the ROM area. In this regard, a display unit (e.g., a display using liquid crystal or LED) that displays the information input to the input unit may be provided for the input unit.

2. Configuration of Memory Device of Memory of an Embodiment

Subsequently, a specific embodiment of the invention will be explained.

FIG. 1 is a schematic configuration diagram (a sectional view of a memory cell) of a memory of an embodiment.

As shown in FIG. 1, on a semiconductor base 10 such as a silicon substrate, a source region 4, a drain region 5, and a gate electrode 7 forming a selection transistor for selecting each memory cell are respectively provided. Of them, the gate electrode 7 also serves as one address wiring (e.g., a word line) extending in a direction orthogonal to the paper surface.

To the drain region 5, a wiring 6 is connected via a contact layer 2.

Further, a memory device 1 is provided between the source region 4 and the other address wiring (e.g., a bit line) 3 provided in the upper part and extending in the horizontal direction in the drawing. The memory device 1 includes a tunnel magnetic resistance effect device having a magnetic free layer (memory layer) including a ferromagnetic layer in which a direction of magnetization is reversed by spin injection.

Furthermore, the memory device 1 is provided near the intersection of the two address wirings 3, 7.

The memory device 1 is connected to the bit line 3 and the source region 4 via the upper and lower contact layers 2, respectively.

Thereby, a current can be supplied to the memory device 1 in a route from the address wiring 3 via the selection transistor to the wiring 6, the current is vertically flown in the memory device 1 (in the stacked direction of the memory device 1), and thereby, the magnetization direction of the memory layer can be reversed by spin injection. That is, the address wiring 3 and the wiring 6 are the above described current supply unit for supplying a current to the memory device 1.

In the memory of the embodiment, specifically, the memory include plural memory devices 1 shown in FIG. 1. Further, the plural memory devices 1 having the same configuration forming the memory are sorted into the random access memory (RAM) area and the read only memory (ROM) area.

In the random access memory (RAM) area, information is recorded using a direction of magnetization of a magnetic free layer of the memory device 1 including the tunnel magnetic resistance effect device.

In the read only memory (ROM) area, information is recorded depending on whether there is breakdown of the tunnel insulating layer of the memory device 1 including the tunnel magnetic resistance effect device or not.

The details of recording of information in the respective areas of the memory device 1 will be explained together with the detailed configuration of the memory device 1, which will be described later.

Figure 2:
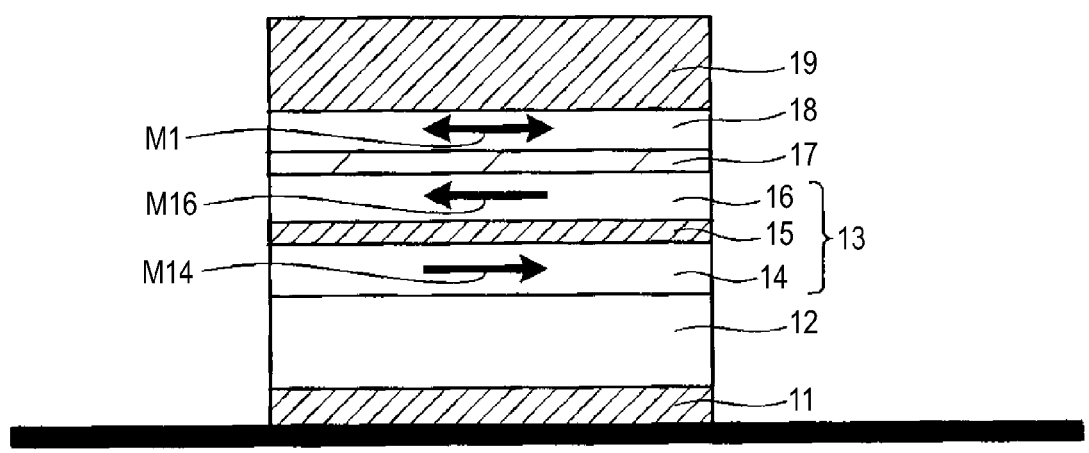
FIG. 2 is a schematic sectional diagram of a memory device in FIG. 1.

Further, FIG. 2 is a schematic sectional diagram of the memory device 1 of the memory of the embodiment.

As shown in FIG. 2, in the memory device 1, a magnetization fixed layer 13 is provided under a magnetic free layer 18 in which the direction of magnetization M1 is reversed by spin injection. Under the magnetization fixed layer 13, an antiferromagnetic layer 12 is provided, and the magnetization direction of the magnetization fixed layer 13 is fixed by the antiferromagnetic layer 12.

Between the magnetic free layer 18 and the lower magnetization fixed layer 13, a tunnel barrier layer (tunnel insulating layer) 17 is provided.

Further, a foundation layer 11 is formed under the antiferromagnetic layer 12, and a cap layer 19 is formed on the magnetic free layer 18.

That is, the memory device 1 shown in FIG. 2 is formed by a tunnel magnetic resistance effect device (TMR device) including the magnetic free layer 18, the tunnel barrier layer (tunnel insulating layer) 17, and the magnetization fixed layer 13.

Further, the magnetization fixed layer 13 has a stacked antiferromagnetic structure.

Specifically, the magnetization fixed layer 13 has a configuration in which two ferromagnetic layers 14, 16 are stacked and antiferromagnetically coupled via a nonmagnetic layer 15.

The respective ferromagnetic layers 14, 16 of the magnetization fixed layer 13 have stacked antiferromagnetic structures, and thus, magnetization M14 of the ferromagnetic layer 14 is directed rightward and magnetization M16 of the ferromagnetic layer 16 is directed leftward and opposite to each other. Thereby, the magnetic fluxes leaking from the respective ferromagnetic layers 14, 16 of the magnetization fixed layer 13 cancel each other.

A metal alloy material containing of one, two, or more of Fe, Ni, Co may be used for the ferromagnetic layers 14, 16 forming the magnetization fixed layer 13. Further, in the metal alloy of these magnetic layers, a transition metal element such as Nb and Zr, a light element such as B and C, and a rare-earth element such as Gd, Tb, and Y may be contained, and, in addition, an oxide or a nitride of them may be used.

As a material of the nonmagnetic layer 15 used for the magnetization fixed layer 13, a material that produces antiferromagnetic interlayer coupling between magnetic layers of Ru, Cu, Rh, Cr, or the like may be used.

As a material of the magnetic free layer 18, a metal alloy material of ferromagnetic materials of one, two, or more of Fe, Ni, Co, or the like may be used. Further, in the magnetic metal alloy, a transition metal element such as Nb and Zr, a light element such as B and C, and a rare-earth element such as Gd, Tb, and Y may be contained, and, in addition, an oxide or a nitride of them may be used.

As a material of the tunnel barrier layer 17, a material of $Al_2O_3$, MgO, HfO, SiO, $SiO_2$, SiN, or the like, or a mixture of them may be used.

As a material of the antiferromagnetic layer 12, a Mn compound such as PtMn, RhMn, RuMn, FeMn, IrMn or the like may be used.

As a material of the foundation layer 11 and the cap layer 19, not specifically limited, but generally, a conductor of a metal or a metal nitride of Ta, Cr, Ti, W, Al, Cu, TiN, or CuN or the like may be used.

The memory device 1 of the embodiment may be manufactured by continuously forming from the foundation layer 11 to the cap layer 19 within vacuum equipment, and then, processing such as etching to form a pattern of the memory device 1. In the above described memory of the embodiment, the memory includes plural memory devices 1 having the configuration shown in FIGS. 1 and 2. Further, as described above, the plural memory devices 1 having the same configuration forming the memory are sorted into the random access memory (RAM) area and the read only memory (ROM) area.

In the random access memory (RAM) area, information is recorded using the direction of magnetization M1 of the magnetic free layer 18 in the memory device 1 including the tunnel magnetic resistance effect device.

When information is recorded in the memory device 1 of the random access memory (RAM) area, a current having a magnitude that reverses the direction of magnetization M1 of the magnetic free layer 18 is supplied to the memory device 1 by spin injection. Then, at recording of information, the resistance of the memory device 1 is changed between a first resistance state of high resistance and a second resistance state of low resistance. Specifically, when the direction of magnetization M16 of the ferromagnetic layer 16 near the magnetic free layer 18 of the magnetization fixed layer 13 and the direction of magnetization M1 of the magnetic free layer 18 are anti-parallel, the resistance is turned into the first resistance state of high resistance, and, when the directions are in parallel, the resistance is turned into the second resistance state of low resistance.

In the read only memory (ROM) area, in the memory device 1 including the tunnel magnetic resistance effect device, information is recorded depending on whether there is breakdown or not in its tunnel barrier layer 17.

When information is recorded in the memory device 1 of the read only memory (ROM) area, a higher voltage than the breakdown withstand voltage of the tunnel barrier layer 17 of the memory device 1 is provided. Thereby, the tunnel barrier layer 17 is broken down and the resistance state of the memory device 1 is turned to a third resistance state of lower resistance than the second resistance of low resistance, and information is recorded. To provide the higher voltage than the breakdown withstand voltage of the tunnel barrier layer 17 of the memory device 1, the voltage is supplied through the wirings (the address wirings 3, 7 in FIG. 1) connected on and under the memory device 1. That is, these address wirings 3, 7 are the above described voltage supply unit that supplies a voltage for causing breakdown in the memory device 1.

Note that, when a power supply voltage of 1.8 V to 3.3 V as the supplied power supply voltage to the IC chip, which is typically used, is used, the thickness of the tunnel barrier layer 17 is adjusted so that a product of the device resistance and the area may be 5 to 30 $\Omega \cdot \mu m^2$ for enabling spin injection recording with the voltage. The thickness of the tunnel barrier layer 17 that satisfies the condition is approximately 0.7 to 1.2 nm.

The breakdown withstand voltage of the tunnel barrier layer 17 within the thickness range is about 1.5 to 2.5 V.

Further, when the memory device 1 is used for the RAM application for which the device should not be destructed in the product life, it is necessary to use the device at a writing voltage lower than the breakdown withstand voltage so that the device may not be broken down or malfunction due to voltage application at writing.

On the other hand, when the device 1 is used for ROM application, it may be necessary to perform writing only once, and writing is performed with a voltage higher than the breakdown withstand voltage to destruct the tunnel barrier layer 17 and the third resistance state having a smaller resistance than the usual low-resistance state is produced.

The tunnel barrier layer 17 that has caused the breakdown is not reversible and the resistance of this state does not change due to temporal change. Accordingly, the third resistance state is permanent and the device may be used as a device for a ROM rewritable only at once.

3. Experimental Example of Memory Device

Here, the memory device 1 having the configuration shown in FIG. 2 is practically fabricated.

Specifically, in the memory device 1 having the configuration shown in FIG. 2, materials and thicknesses of the respective layers are selected as shown in the following film configuration. That is, the foundation film 11 is a Ta film in thickness of 3 nm, the antiferromagnetic layer 12 is a PtMn film in thickness of 20 nm, the ferromagnetic layer 14 forming the magnetization fixed layer 13 is a CoFe film in thickness of 2 nm, the nonmagnetic layer 15 is a Ru film in thickness of 0.8 nm, the ferromagnetic layer 16 is a CoFeB film in thickness of 4 nm. Further, the tunnel barrier layer 17 is a magnesium oxide film in thickness of 0.9 nm, the magnetic free layer 18 is a CoFeB film in thickness of 2 nm, the cap layer 19 is a Ta film in thickness of 5 nm. Furthermore, a Cu film (not shown) in thickness of 50 nm (to be a word line, which will be described later) is provided between the foundation film 11 and the antiferromagnetic layer 12. Note that the composition of the CoFeB films of the magnetic free layer 18 and the ferromagnetic layer 16 is Co40Fe20B (atomic percent), the composition of the PtMn film of the antiferromagnetic layer 12 is Pt50Mn50 (atomic percent), and the composition of the CoFe film of the ferromagnetic layer 14 is Co90Fe10 (atomic percent).

In this manner, the respective layers of the memory device 1 are formed.

Film configuration: Ta(3 nm)/Cu(50 nm)/PtMn(20 nm)/CoFe(2 nm)/Ru(0.8 nm)/CoFeB(4 nm)/MgO(0.9 nm)/CoFeB(2 nm)/Ta(5 nm)

The respective layers other than the tunnel barrier layer 17 including the magnesium oxide film are formed using DC magnetron sputtering.

The tunnel barrier layer 17 including the magnesium oxide (MgO) film is formed using RF magnetron sputtering.

Then, the respective layers of the memory device 1 are continuously formed within vacuum equipment by sputtering.

Then, heat treatment is performed with 10 kOe, at 360° C., for two hours in a heat treating furnace, and ordering heat treatment of the PtMn film of the antiferromagnetic layer 12 is performed.

Next, the word line part is masked by photolithography, then, selective etching is performed on the stacked films of the part other than the word line using Ar plasma, and thereby, the word line (lower electrode) is formed. In this regard, the part other then the word line part is etched to the depth of 5 nm of the substrate.

Then, the mask of the pattern of the memory device 1 is formed using an electron beam drawing system, then, selective etching is performed on the stacked films, and thereby, the memory device 1 is formed. The part other than the memory device 1 is etched to immediately above the Cu layer of the word line. In this regard, the pattern of the memory device 1 has an oval shape in short axis of 80 nm×long axis of 240 nm.

Next, the part other than the memory device 1 part is insulated by sputtering of $Al_2O_3$.

Then, using photolithography, the bit line to be an upper electrode and a measurement pad are formed.

In this manner, a sample of the memory device 1 of working example 1 is fabricated.

Regarding one memory device 1 of the sample of working example 1, the resistance of the memory device 1 is measured while the voltage applied to the memory device 1 is changed from −1 V to +1 V.

Figure 3:
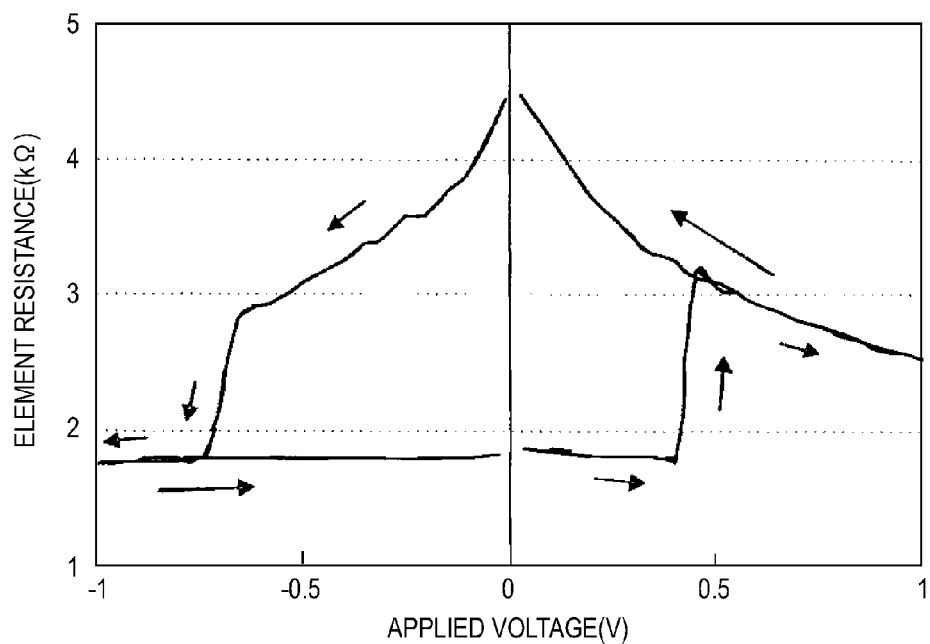
FIG. 3 shows relations between an applied voltage and a device resistance of the memory device.

As a measurement result, FIG. 3 shows relations between the voltage applied to the memory device 1 and the device resistance of the memory device 1.

As seen from FIG. 3, the direction of magnetization M1 of the magnetic free layer (memory layer) 18 can be changed by the spin injection magnetization reversal effect by changing the direction of the current flown in the memory device 1 including the tunnel magnetic resistance effect device. Thereby, the direction of magnetization M1 of the magnetic free layer (memory layer) 18 can be changed to be in parallel or anti-parallel relative to the direction of magnetization M16 of the ferromagnetic layer 16 of the magnetization fixed layer 13. It is known that the resistance of the memory device 1 changes by the magnetic resistance effect with the change of the direction of magnetization M1 of the magnetic free layer (memory layer) 18.

Next, measurement of applying a voltage pulse to each of the several memory devices 1 of the sample of working example 1 and then measuring the resistance of the device is performed while the voltage of the applied pulse is raised higher than the operation voltage range as a RAM. Note that, before measurement, the resistance of the memory device 1 is set to be in the high-resistance state.

Figure 4:
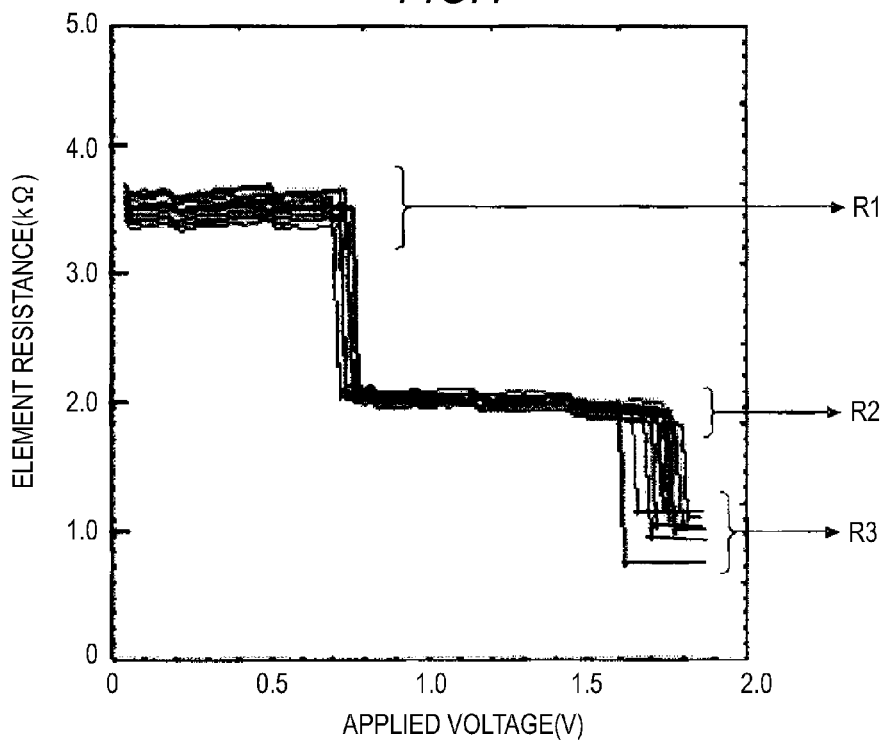
FIG. 4 shows changes of the device resistance of the memory devices as the applied voltage is raised.

As a measurement result, the changes of the device resistance of the several memory devices 1 are superimposed and shown in FIG. 4.

As shown in FIG. 4, in an area where the voltage of the applied pulse is low, the first resistance state R1 of high resistance as an initial state is shown. As the applied voltage is raised, magnetization reversal is caused by spin injection and the state turns into the second resistance state R2 of low resistance. As the applied voltage is further raised, the tunnel barrier layer 17 breaks down, the device resistance further becomes lower from the second resistance state R2 of low resistance, and the state turns into the third resistance state R3 as the state in which the barrier conducts.

Using the three resistance states (the first resistance state R1, the second resistance state R2, the third resistance state R3) of the memory device 1, the ROM and the RAM may be mixed in the memory having plural memory devices 1 in FIG. 2.

4. Circuit Configuration of One Embodiment of Memory

Next, a circuit configuration of the memory of the embodiment will be explained.

Figure 5:
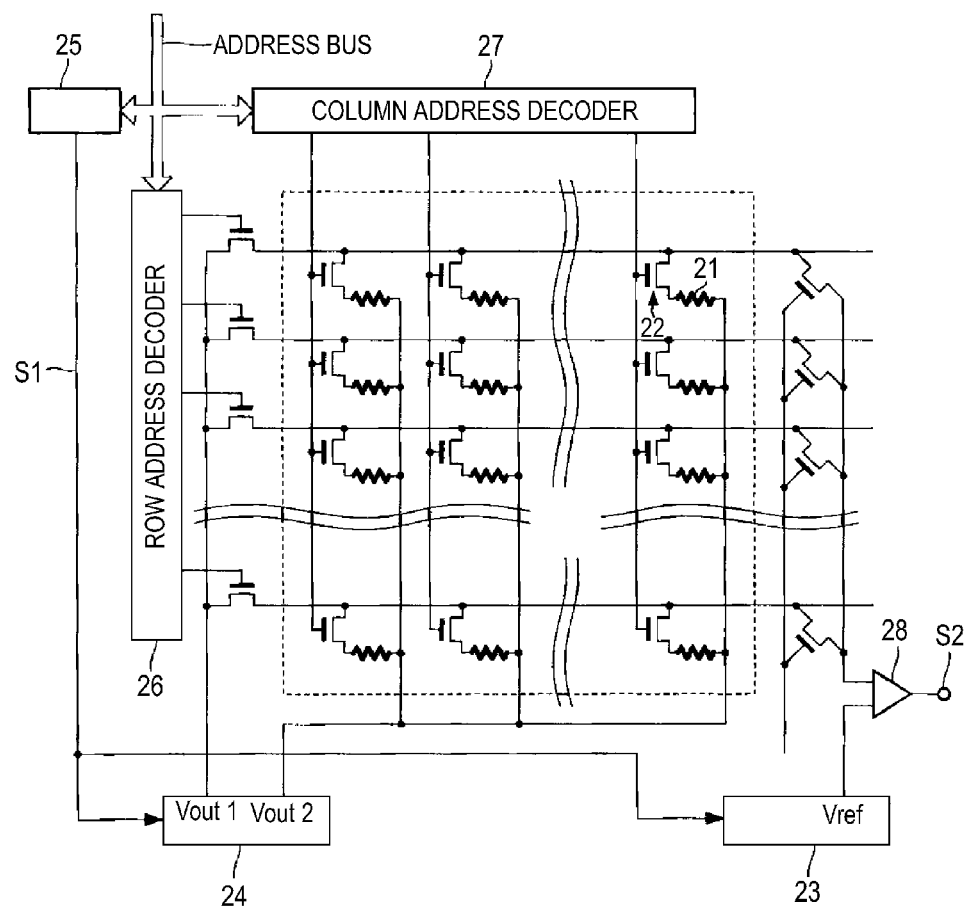
FIG. 5 is a schematic configuration diagram of a circuit configuration of the memory of the one embodiment of the invention.

FIG. 5 is a schematic configuration diagram of the circuit configuration of the embodiment (the memory of the one embodiment of the invention).

As shown in FIG. 5, a cell selection transistor 22 is series-connected to a memory device 21 (corresponding to the memory device 1 in FIG. 2), and these memory device 21 and cell selection transistor 22 form each memory cell.

Many memory cells are arranged in a matrix, and the cell selection transistors 22 of the memory cells are connected to lateral wirings with respect to each TOW.

At the downstream of the lateral wirings, a sense amplifier 28 for discrimination of the resistance states of the memory devices 21 is connected. To the sense amplifier 28, a threshold value generation circuit 23 that can switchably generate two voltages is connected.

At the lower left in the drawing, a writing voltage generation circuit 24 that can similarly switchably generate two voltages is provided.

At the upper left in the drawing, a function selection address decoder 25 that determines the input address data and generates a ROM area selection signal and a RAM area selection signal as an area selection signal S1 is provided.

Further, a row address decoder 26 is provided for the lateral wirings to which the memory cells of each row are connected.

In the memory cells of each column, longitudinal wirings are provided in connection to the gate electrodes of the cell selection transistors 22 of the memory cells. Further, the longitudinal wirings are connected to a column address decoder 27.

The function selection address decoder 25 enables the ROM area selection signal when an address range used as a ROM set in advance is input as address data. The ROM area selection signal is input to the threshold value generation circuit 23 and the writing voltage generation circuit 24.

Similarly, the function selection address decoder 25 enables the RAM area selection signal when an address range used as a RAM set in advance is input as address data. The RAM area selection signal is input to the threshold value generation circuit 23 and the writing voltage generation circuit 24.

Further, the threshold value generation circuit 23 and the writing voltage generation circuit 24 determine whether the ROM area or the RAM area has been selected using the ROM area selection signal or the RAM area selection signal, and controls the voltage to be generated in response to the selected area.

The threshold value generation circuit 23 generates a threshold voltage. Using the threshold voltage, the resistances can be discriminated in the sense amplifier 28.

In the RAM area, the threshold voltage is set to a first threshold voltage between input voltages to the sense amplifier 28 generated in the first resistance state R1 and the second resistance state R2 of the memory device 21, respectively. Further, in the ROM area, the threshold voltage is set to a second threshold voltage between input voltages to the sense amplifier 28 generated in the third resistance state R3 and the second resistance state R2 of the memory device 21, respectively.

When information is recorded in the memory device 21 in the RAM area, the writing voltage generation circuit 24 generates a first writing voltage lower than the breakdown voltage of the tunnel barrier layer 17 as the writing voltage.

On the other hand, when information is recorded in the memory device 21 in the ROM area, the writing voltage generation circuit 24 generates a second writing voltage higher than the breakdown voltage of the tunnel barrier layer 17.

Further, at readout, the writing voltage generation circuit 24 generates a voltage sufficiently lower than the first writing voltage so that writing may not be performed.

In the embodiment, the writing voltage generation circuit 24 and the sense amplifier 28 connected to the memory devices 21 and the cell selection transistors 22 are the same circuit for the RAM area and the ROM area. Accordingly, at circuit designing and wafer manufacturing, it is not necessary to distinguish the RAM area and the ROM area with respect to the part of the memory devices 21.

For segmentation of the RAM area and the ROM area, it is necessary only to change setting of the respective voltages of the writing voltage generated in the writing voltage generation circuit 24 and the threshold voltage generated in the threshold value generation circuit 23 and input to the sense amplifier 28 at operation.

For example, usually, the first writing voltage and the first threshold voltage for RAM operation are provided. Then, when addresses desired to be used as the ROM area are accessed, only the address decoder circuit is altered to generate the ROM area selection signal as the area selection signal S1 from the function selection address decoder 25. Then, using the ROM area selection signal, the second writing voltage may be provided to the writing voltage generation circuit 24 and the second threshold voltage may be provided to the sense amplifier 28.

According to the above described memory of the embodiment, in the random access memory (RAM) area, the direction of magnetization M1 of the magnetic free layer 18 of the memory device 1 is reversed and information is recorded. Further, in the read only memory (ROM) area, the voltage higher than the breakdown withstand voltage of the tunnel barrier layer 17 of the memory device 1 is provided to break down the tunnel barrier layer 17 into the third resistance state R3, and information is recorded.

Thereby, it may be possible to use the memory device 1 shown in FIG. 2 as the random access memory (RAM) or the read only memory (ROM).

In this manner, using the memory devices 1 having the same configuration, both the random access memory (RAM) and the read only memory (ROM) may be realized. Thereby, a ROM chip and a RAM chip that have been separately manufactured in related art can be replaced by one chip.

Further, since both the RAM and the ROM can be realized using the memory devices 1 having the same configuration, the types of circuit parts and the manufacturing cost can be reduced.

Furthermore, since a circuit that has been formed by two independent chips of a ROM chip and a RAM chip can be formed by one chip, and simplification of the circuit configuration of the memory and downsizing of the memory can be realized.

5. Modified Examples

In the above described embodiment, the magnetization fixed layer 13 of the memory device 1 has a stacked antiferromagnetic structure of the nonmagnetic layer 15 sandwiched between the two ferromagnetic layers 14, 16.

In the embodiments of the invention, the magnetization fixed layer may include only one ferromagnetic layer, or the magnetization fixed layer may have a stacked antiferromagnetic structure including three or more ferromagnetic layers.

In the above described embodiment, the direction of magnetization M1 of the magnetic free layer 18 is reversed by the spin injection method for the memory device 1.

An embodiment includes the case where the direction of magnetization of the magnetic free layer is reversed by applying an external magnetic field to the magnetic free layer for the memory device including the tunnel magnetic resistance effect device like an MRAM in related art. In this case, the voltage that breaks down the tunnel insulating layer of the memory device in the ROM area is applied to the memory device through wiring connected to the memory device (the readout wiring for sensing the resistance value and reading out contents of the recorded information or another wiring).

Further, as a memory of another embodiment, the following configuration can be employed.

First, plural memory devices are formed and a chip in which neither ROM area nor RAM area is completely distinguished is prepared.

For the chip, an input unit that externally inputs information is provided.

When the chip is practically used, for the contents of the information input to the input unit, for example, a signal of an area used as a ROM area is provided as an external signal. Thereby, the chip is operated so that some memory devices of the plural memory devices may be assigned to a RAM area and the other memory devices may be assigned to the ROM area.

In this manner, both the ROM area and the RAM area can be together in the chip.

Further, in the case of the configuration, compared to the configuration having a RAM chip and a ROM chip in related art, the types of memory devices and circuit parts can be reduced, and the types of masks for manufacturing can be reduced. Thereby, the material cost and the manufacturing cost can be reduced.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A memory comprising:
   a plurality of memory devices, each including a tunnel magnetic resistance effect device containing
   a magnetization free layer in which a direction of magnetization can be reversed,
   a tunnel barrier layer including an insulating material, and
   a magnetization fixed layer provided with respect to the magnetization free layer via the tunnel barrier layer with a fixed direction of magnetization;
   a random access memory area in which information is recorded using the direction of magnetization of the magnetization free layer of the memory device; and
   a read only memory area in which information is recorded depending on whether there is breakdown of the tunnel barrier layer of the memory device or not.

2. The memory according to claim 1, wherein the memory device in the random access memory area and the memory device in the read only memory area are accommodated within the same chip.

3. The memory according to claim 1, further comprising a voltage supply unit that supplies a voltage for causing breakdown by applying a voltage higher than a breakdown withstand voltage of the tunnel barrier layer to the memory device in the read only memory area.

4. The memory according to claim 1, further comprising a current supply unit that supplies a current to the memory device in the random access memory area for recording information by reversing the direction of magnetization of the magnetization free layer by spin injection.

5. The memory according to claim 1, further comprising an input unit that externally inputs information, wherein some memory devices of the plural memory devices are assigned to the random access memory area and the other memory devices are assigned to the read only memory area in response to contents of the information input to the input unit.

* * * * *